(12) United States Patent
Theuss

(10) Patent No.: US 11,967,562 B2
(45) Date of Patent: Apr. 23, 2024

(54) PACKAGED SEMICONDUCTOR DEVICE AND METHOD FOR FABRICATING A PACKAGED SEMICONDUCTOR DEVICE

(71) Applicant: Infineon Technologies AG, Neubiberg (DE)

(72) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 73 days.

(21) Appl. No.: 17/221,974

(22) Filed: Apr. 5, 2021

(65) Prior Publication Data
US 2021/0313275 A1 Oct. 7, 2021

(30) Foreign Application Priority Data
Apr. 6, 2020 (DE) ...................... 10 2020 109 555.4

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 23/3121; H01L 23/5383; H01L 23/5386; H01L 23/552; H01L 23/66; H01L 23/16; H01L 23/49822; H01L 23/49811; H01L 23/31; H01L 23/485; H01L 23/49838; H01L 21/4853; H01L 21/4857; H01L 21/565; H01L 21/568; H01L 21/78; H01L 21/561; H01L 21/50; H01L 21/782; H01L 2223/6677;
(Continued)

(56) References Cited

U.S. PATENT DOCUMENTS 9,768,037 B2 9/2017 Palm et al.
2002/0053724 A1* 5/2002 Lai ...................... H01L 23/3128
257/679
(Continued)

FOREIGN PATENT DOCUMENTS

DE 10 2015 107 445 11/2015

*Primary Examiner* — Kyoung Lee
*Assistant Examiner* — Christina A Sylvia
(74) *Attorney, Agent, or Firm* — Dicke, Billig & Czaja, PLLC

(57) ABSTRACT

A method for fabricating packaged semiconductor devices is disclosed. In one example the method comprises providing a plurality of semiconductor dies, the semiconductor dies being arranged in an array on a carrier such that a first side of the semiconductor dies faces the carrier and such that an empty space is arranged laterally besides each semiconductor die. A substrate comprising a plurality of conductive elements is arranged over the plurality of semiconductor dies such that a conductive element is arranged in the respective empty space besides each one of the semiconductor dies. The plurality of semiconductor dies are molded over to form a molded body, and singulating packaged semiconductor devices from the molded body by cutting through the molded body.

7 Claims, 4 Drawing Sheets

(51) Int. Cl.
  *H01L 21/56* (2006.01)
  *H01L 21/78* (2006.01)
  *H01L 23/00* (2006.01)
  *H01L 23/31* (2006.01)
  *H01L 23/552* (2006.01)
  *H01L 23/66* (2006.01)

(52) U.S. Cl.
  CPC .......... *H01L 21/565* (2013.01); *H01L 21/568* (2013.01); *H01L 21/78* (2013.01); *H01L 23/3121* (2013.01); *H01L 23/5383* (2013.01); *H01L 23/5386* (2013.01); *H01L 23/552* (2013.01); *H01L 23/66* (2013.01); *H01L 24/19* (2013.01); *H01L 24/20* (2013.01); *H01L 2223/6677* (2013.01); *H01L 2224/214* (2013.01); *H01L 2924/3025* (2013.01)

(58) Field of Classification Search
  CPC ........... H01L 2224/214; H01L 2224/18; H01L 2224/96; H01L 2224/04105; H01L 2224/02379; H01L 2924/3025; H01L 2924/18162; H01L 25/105; H01L 2225/1035; H01L 2225/1041
  See application file for complete search history.

(56) References Cited

U.S. PATENT DOCUMENTS

| | | |
|---|---|---|
| 2009/0283870 A1* | 11/2009 | Pagaila .................... H01L 24/19 438/109 |
| 2011/0127654 A1 | 6/2011 | Weng et al. |
| 2014/0008811 A1* | 1/2014 | Yap .................... H01L 23/49861 257/774 |
| 2014/0077361 A1 | 3/2014 | Lin et al. |
| 2015/0145113 A1* | 5/2015 | Chen .................. H01L 23/49816 257/690 |
| 2016/0043047 A1 | 2/2016 | Shim et al. |
| 2016/0268190 A1* | 9/2016 | Mcknight-Macneil ...................... H01L 23/3107 |
| 2017/0033024 A1* | 2/2017 | Busche .................... H01L 21/50 |
| 2017/0117162 A1* | 4/2017 | Busche .................... H01L 21/56 |
| 2017/0154811 A1 | 6/2017 | Wu et al. |
| 2018/0269181 A1* | 9/2018 | Yang .................... H01L 21/561 |
| 2019/0051632 A1 | 2/2019 | Ji et al. |
| 2019/0259689 A1* | 8/2019 | Lui .................... H05K 1/0265 |
| 2019/0304885 A1 | 10/2019 | Cheah et al. |
| 2021/0013136 A1* | 1/2021 | Cho .................. H01L 23/49861 |

* cited by examiner

PACKAGED SEMICONDUCTOR DEVICE AND METHOD FOR FABRICATING A PACKAGED SEMICONDUCTOR DEVICE

CROSS-REFERENCE TO RELATED APPLICATION

This Utility patent application claims priority to German Patent Application No. 10 2020 109 555.4, filed Apr. 6, 2020, which is incorporated herein by reference.

TECHNICAL FIELD

This disclosure relates in general to a packaged semiconductor device and to a method for fabricating a packaged semiconductor device.

BACKGROUND

Packaged semiconductor devices may comprise a semiconductor die encapsulated by a molded body. The semiconductor die may comprise electrical contacts which are arranged at a first side, e.g. the bottom side, of the packaged semiconductor device. One or more vertical interconnects may be used to redirect one or more of the electrical contacts of the semiconductor die or other electrical components to a second side, e.g. the top side, of the packaged semiconductor device, opposite the first side. Providing electrical contacts on two opposing sides of a packaged semiconductor device may for example enable a stacking of devices and may thereby help with ongoing miniaturization efforts of electronic components. However, during fabrication of packaged semiconductor devices the additional processing step of providing such vertical interconnects may increase overall fabrication times and fabrication costs. For these and other reasons there may be a need for improved packaged semiconductor devices as well as for improved methods for fabricating packaged semiconductor devices.

The problem on which the invention is based is solved by the features of the independent claims. Further advantageous examples are described in the dependent claims.

SUMMARY

Various aspects pertain to a method for fabricating packaged semiconductor devices, the method comprising: providing a plurality of semiconductor dies, the semiconductor dies being arranged in an array on a carrier such that a first side of the semiconductor dies faces the carrier and such that an empty space is arranged laterally besides each semiconductor die, arranging a substrate comprising a plurality of conductive elements over the plurality of semiconductor dies such that a conductive element is arranged in the respective empty space besides each one of the semiconductor dies, molding over the plurality of semiconductor dies to form a molded body, and singulating packaged semiconductor devices from the molded body by cutting through the molded body.

Various aspects pertain to a packaged semiconductor device, comprising: a semiconductor die comprising a first side and an opposing second side, a molded body encapsulating the semiconductor die and comprising a first side and an opposing second side, a first redistribution layer arranged on the first sides of the semiconductor die and the molded body, and a conductive element arranged in the molded body laterally besides the semiconductor die, wherein the conductive element extends from the first redistribution layer at least to a plane comprising the second side of the semiconductor die.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

In the following detailed description directional terminology such as "top", "bottom", "left", "right", "upper", "lower" etc. is used with reference to the orientation of the Figure(s) being described. Because components of the disclosure can be positioned in a number of different orientations, the directional terminology is used for purposes of illustration only. It is to be understood that other examples may be utilized and structural or logical changes may be made.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The semiconductor dies mentioned further below may be of different types, may be manufactured by different technologies and may include for example integrated electrical, electro-optical or electro-mechanical circuits, logic integrated circuits, control circuits, etc.

The packaged semiconductor devices described below may include one or more semiconductor dies. By way of example, one or more semiconductor power dies may be included. Further, one or more logic integrated circuits may be included in the devices. The logic integrated circuits may be configured to control the integrated circuits of other semiconductor dies, for example the integrated circuits of power semiconductor dies. The logic integrated circuits may be implemented in logic dies.

Figure 1:
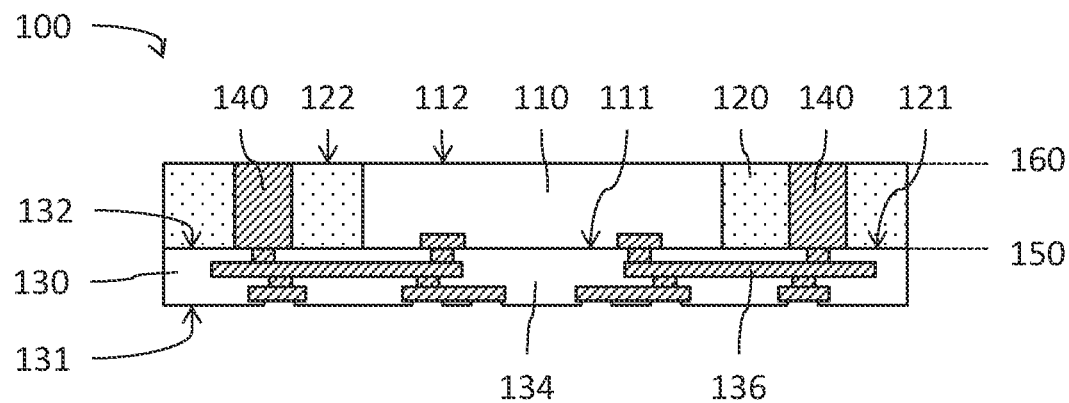
FIG. 1 shows a sectional view of a packaged semiconductor device.

FIG. 1 shows a packaged semiconductor device 100 comprising a semiconductor die 110, a molded body 120, a first redistribution layer 130 and a conductive element 140.

The semiconductor die 110 comprises a first side 111 and an opposing second side 112. The molded body 120 at least partially encapsulates the semiconductor die 110 and comprises a first side 121 and an opposing second side 122. The first redistribution layer 130 is arranged on the first sides 111, 121 of the semiconductor die 110 and the molded body 120. The conductive element 140 is arranged in the molded body 120 laterally besides the semiconductor die 110 and extends from the first redistribution layer 130 at least to a second plane 160 comprising the second side 112 of the semiconductor die 110.

The semiconductor die 110 may for example comprise electrical contacts on the first side 111 but no electrical contacts on the second side 112. According to another example, the semiconductor die 110 may comprise electrical contacts on both sides 111, 112. The second side 112 may e.g. be a backside of the semiconductor die 110. The semiconductor die 110 may be a thinned die, meaning that a backside grinding process was used to reduce the thickness of the semiconductor die 110. The semiconductor die 110 may e.g. have a thickness measured between the first and second sides 111, 112 in the range of 50 µm to 800 µm, for example about 100 µm, about 200 µm or about 500 µm.

The first redistribution layer 130 may comprise an insulating material 134 and a plurality of conductive tracks 136. The insulating material 134 may e.g. comprise a laminate or an oxide layer. The conductive tracks 136 may be coupled to the electrical contacts of the semiconductor die 110 on the first side 111 of the semiconductor die. At least some of the electrical contacts may be redistributed by the conductive tracks 136 to respective points outside the circumference of the semiconductor die 110 (fan-out configuration). A first side 131 of the first redistribution layer facing away from the semiconductor die 110 may be configured to have solder balls attached to the ends of the conductive tracks 136. A second side 132 of the first redistribution layer 130, the first side 111 of the semiconductor die 110 and a lower end of the conductive element 140 may be arranged in a first plane 150.

The molded body 120 may completely cover lateral sides of the semiconductor die 110 between the first side 111 and the second side 112. According to an example, the first side 111 and/or the second side 112 are not covered by the molded body 120. A lower side of the molded body 120 may be coplanar with the first side 111 of the semiconductor die 110. An upper side of the molded body 120 may be arranged in the second plane 160.

The conductive element 140 may have any suitable shape and any suitable lateral dimensions. The conductive element 140 may also be termed a "vertical interconnect" or a "through-mold via". The conductive element 140 may comprise any suitable conductor, e.g. a metal like Al, Cu or Fe or a metal alloy comprising one of these metals. The conductive element 140 may be a single solid body, e.g. a single metal piece like a leadframe part. According to another example, the conductive element 140 may instead comprise an insulating part and a conductive track deposited on the insulating part, e.g. a semiconductor wafer part with a metallization or a plastic or polymer part with a metallization. The conductive element 140 may be arranged laterally at a distance from the semiconductor die 110, e.g. at a distance of 1 mm, 5 mm or more.

The conductive element 140, in particular the lower end of the conductive element 140, may be coupled (e.g. by a solder joint or by conductive glue) to a conductive track 136 of the first redistribution layer 130 and thereby to an electrical contact of the semiconductor die 110. The conductive element 140 may be configured as a via, in particular a through-mold via, and it may be configured to redirect an electrical contact of the semiconductor die 110 towards the upper side of the packaged semiconductor device 100. In the case that the packaged semiconductor device 100 comprises more than one conductive element 140, individual conductive elements 140 may be coupled to different ones of the conductive tracks 136 and thereby to different electrical contacts of the semiconductor die 110.

The conductive element 140 may for example be configured to act as an electromagnetic shielding structure or part of a shielding structure for the semiconductor die 110, as an antenna or part of an antenna, e.g. a radar antenna, as an RF-structure or part of an RF-structure or as a part of a redistribution structure of the packaged semiconductor device 100.

According to an example, the conductive element 140 is a thinned piece, meaning that a grinding process was used to reduce the thickness of the conductive element (the thickness being measured perpendicular to the first and second planes 150, 160). The ground surface of the conductive element 140 may be its upper end arranged in or above the second plane 160.

According to an example, the packaged semiconductor device 100 may comprise more than one conductive element 140, e.g. two, three, four or more. For example, two conductive elements 140 may be arranged at opposing lateral sides of the semiconductor die 110 as shown in FIG. 1. Furthermore, the packaged semiconductor device 100 may comprise more than one semiconductor die 110 and one or more conductive elements 140 may be arranged besides each one of the semiconductor dies 110.

Figure 2:
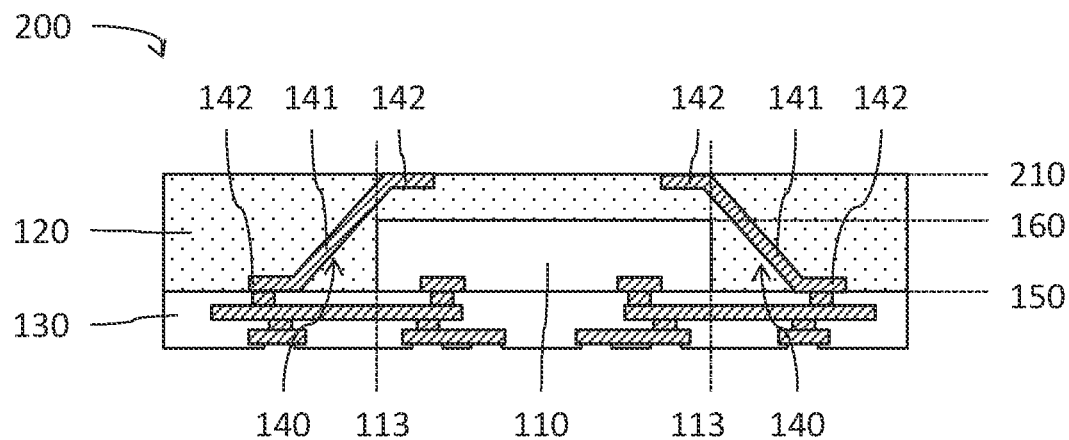
FIG. 2 shows a sectional view of a further packaged semiconductor device comprising a conductive element that extends to a point within the circumference of a semiconductor die.

FIG. 2 shows a further packaged semiconductor device 200 which may be similar to or identical with the packaged semiconductor device 100, except for the differences described in the following.

In the semiconductor device 200 the conductive element 140 extends from the first redistribution layer 130 (i.e. from the first plane 150) to the second plane 160 comprising the second side 112 of the semiconductor die 110 and further to a third plane 210 arranged above the second plane 160. In the packaged semiconductor device 200 the thickness of the conductive element 140 therefore is greater than the thickness of the semiconductor die 110.

Furthermore, in the packaged semiconductor device 200 the conductive element 140 extends from a first point laterally besides the semiconductor die 110 to a second point above the second side 112 of the semiconductor die 110 and within the circumference 113 of the semiconductor die 110.

In particular, the conductive element 140 may cross the circumference 113 of the semiconductor die above the second plane 150.

According to an example, the conductive element 140 comprises a sloped part 141. The sloped part 141 may e.g. be arranged with an angle in the range of 30° to 80°, e.g. about 45°, relative to the first and second sides 111, 112 of the semiconductor die 110. The sloped part 141 may extend from the first plane 150 to the second plane 160, as shown in the example of FIG. 2. However, it is also possible that the conductive element 140 has a different shape with a sloped part 141 which extends only over part of the distance between the two planes 150, 160.

The conductive element 140 may also comprise one or more horizontal parts 142 that are parallel to the first and second sides 111, 112 of the semiconductor die 110. For example, horizontal parts 142 may be arranged at the upper and lower ends of the conductive element 140. According to an example, only a horizontal part 142 crosses the circumference 113 of the semiconductor die 110. According to another example, the sloped part 141 crosses the circumference and the horizontal part 142 at the upper end of the conductive element 140 is arranged completely inside the circumference 113 of the semiconductor die 110.

According to an example, the conductive element 140 comprises a horizontal part 142 at its upper end and this horizontal part 142 is exposed from the molded body 120 in the third plane 210.

The conductive element 140 may cover only a part of the surface area of the second side 112 of the semiconductor die 110 or it may cover the surface area of the second side 112 completely, e.g. in the case that the conductive element 140 is configured as an electromagnetic shielding for the semiconductor die 110.

The conductive element 140 comprising the sloped part 141 and the horizontal part(s) 142 may for example be fabricated by stamping or bending a leadframe.

Figure 3:
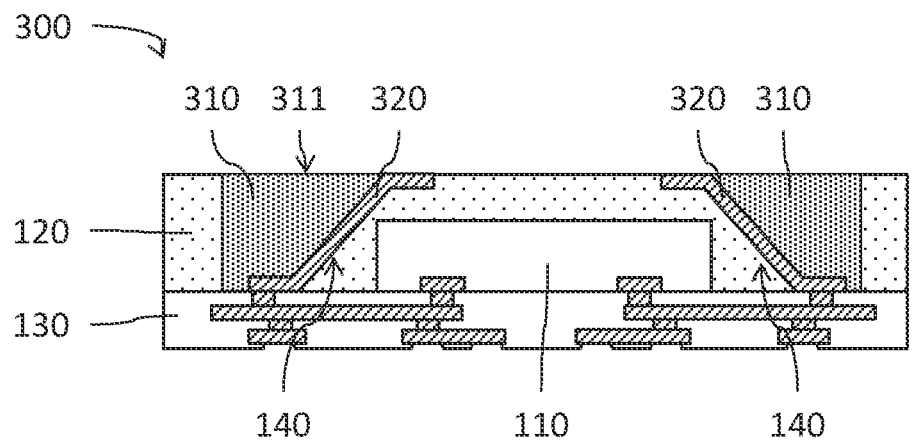
FIG. 3 shows a sectional view of a further packaged semiconductor device, wherein the conductive element comprises a conductive track deposited on an insulating part.

FIG. 3 shows a packaged semiconductor device 300 which may be similar to or identical with the semiconductor devices 100 and 200, except for the differences described in the following.

In the packaged semiconductor device 300 the conductive element 140 comprises an insulating part 310 and a conductive track 320 arranged on the insulating part 310. The conductive track 320 may e.g. be deposited on the insulating part 310 by plating, spraying, dispensing, vapor deposition, etc. The conductive track 320 may e.g. be fabricated using lithography and/or laser structuring.

According to an example, the insulating part 310 comprises a "laser activatable part" which comprises an electrically insulating material like a ceramic or an epoxy and an additive, e.g. in the form of an organic metal complex. The additive may undergo a physiochemical reaction induced by irradiation with a laser. The energy of the laser may produce laser activated regions on the surface of the laser activatable part, the laser activated regions comprising exposed metal complexes which may act as seeds for a metal plating process. Those surface regions which were not irradiated with the laser do not comprise exposed metal complexes and therefore will not receive a metal plating.

The insulating part 310 may e.g. comprise a semiconductor material, e.g. Si, and it may be a part of a semiconductor wafer. According to another example, the insulating part 310 may e.g. comprise a plastic or a polymer. In this case the insulating part 310 may have the same or a different material composition as the molded body 120.

The insulating part 310 may comprise a ground surface 311, wherein a grinding process was used to thin the insulating part 310. The grinding process may have been used to expose the conductive track 320. The ground surface 311 and a part of the conductive track 320 may be coplanar. The conductive track 320 may comprise a sloped part 141 and one or more horizontal parts 142 as described with respect to FIG. 2.

Figure 4:
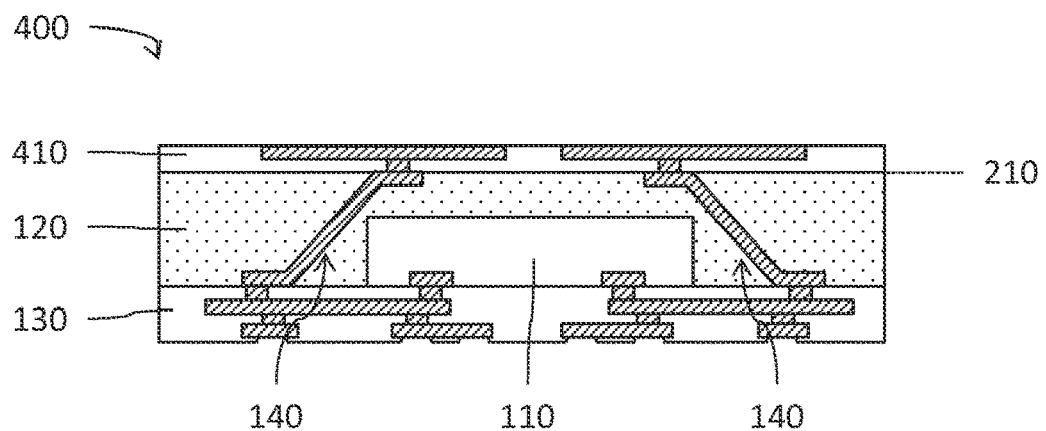
FIG. 4 shows a sectional view of a packaged semiconductor device comprising redistribution layers on opposing sides of a molded body.

FIG. 4 shows a further packaged semiconductor device 400 which may be similar to or identical with the packaged semiconductor devices 100, 200 and 300, except for the differences described in the following.

The packaged semiconductor device 400 comprises a second redistribution layer 410 opposite the first redistribution layer 130. In the case that the packaged semiconductor device 400 is similar to the packaged semiconductor device 100, the second redistribution layer 410 may be arranged in the second plane 160 (not shown in FIG. 4). In the case that the packaged semiconductor device 400 is similar to the packaged semiconductor devices 200 and 300, the second redistribution layer 410 may be arranged in the third plane 210 (see FIG. 4).

The second redistribution layer 410 may be electrically coupled to the one or more conductive elements 140, e.g. by solder joints or conductive glue. The second redistribution layer 410 may comprise the same materials or material composition as the first redistribution layer 130. However, it is also possible that the two redistribution layers 130, 410 comprise different materials or material compositions. The first and/or second redistribution layers 130, 410 may each comprise a single-layer or a multi-layer structure.

The second redistribution layer 410 may e.g. be configured to allow stacking of semiconductor devices, i.e. a further semiconductor device may be arranged over the second redistribution layer 410 and electrically connected to it, e.g. by solder balls ("package-on-package"). It is also possible that any other suitable electrical components, e.g. a capacitor or a resistor, be arranged on and coupled to the second redistribution layer 410.

Since the second redistribution layer 410 covers the backside of the packaged semiconductor device 400, the conductive element 140 need not necessarily be exposed to the outside at the backside of the packaged semiconductor device 400.

FIGS. 5A to 5G show the packaged semiconductor device 200 in various stages of fabrication according to an exemplary method for fabricating packaged semiconductor devices. A similar method may be used for fabricating the packaged semiconductor devices 100, 300 and 400.

Figure 5A:
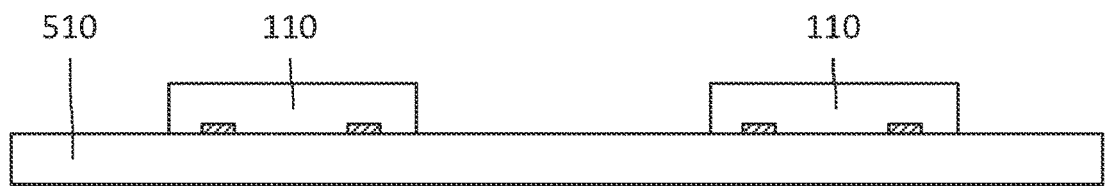
FIGS. 5A-5G show sectional views of a packaged semiconductor device in various stages of fabrication according to an exemplary method for fabricating a packaged semiconductor device.

FIG. 5A shows a plurality of semiconductor dies 110 arranged on a carrier, e.g. a temporary carrier 510. The plurality of semiconductor dies 110 may e.g. be arranged in a matrix or array. The temporary carrier 510 may e.g. comprise an adhesive tape. The semiconductor dies 110 are arranged in a predefined distance relative to each other, such that at least one conductive element 140 may be placed next to each semiconductor die 110. Arranging the plurality of semiconductor dies 110 on the temporary carrier 510 may comprise using a pick-and-place process.

Figure 5B:
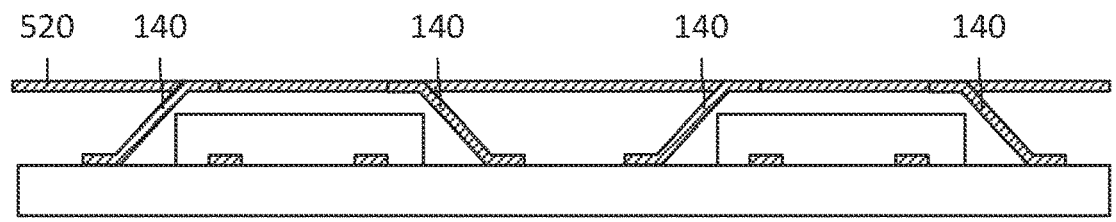

As shown in FIG. 5B, a plurality of conductive elements 140 is arranged on the temporary carrier 510 next to the semiconductor dies 110. The conductive elements 140 may all be part of a common substrate 520 when they are arranged on the temporary carrier 510. In other words, arranging the plurality of conductive elements 140 on the temporary carrier 510 may comprise providing a single common substrate 520 and placing the single common substrate 520 onto the temporary carrier 510. The common substrate 520 may for example comprise a panel, a metal part, in particular a leadframe, a semiconductor wafer or a plastic or polymer body.

Using the common substrate 520 to provide the plurality of conductive elements 140 as described above has the advantage that a parallel process instead of a serial pick-and-place process is used. This may reduce fabrication time and fabrication costs of packaged semiconductor devices.

Figure 5C:
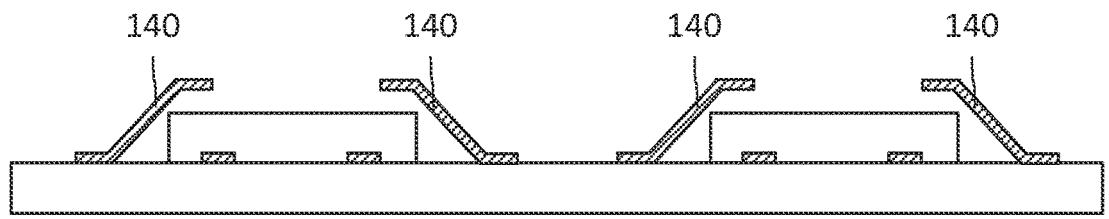

As shown in FIG. 5C, a singulation process may be used to singulate the individual conductive elements 140 from the common substrate 520. The singulation process may entail cutting through the common substrate 520 or grinding the common substrate 520 to singulate the individual conductive elements 140. After singulation the conductive elements 140 may e.g. be held in place by an adhesive tape of the temporary carrier 510.

The singulation process described with reference to FIG. 5C is not mandatory. It is also possible that the conductive elements 140 are singulated at a later stage of fabrication. For example, the conductive elements 140 may be singulated by the grinding process described further below with reference to FIG. 5F. This may in particular be done in the case that the common substrate 510 is a semiconductor wafer or a plastic or polymer body. In the case that the common substrate 510 is a metal part like a leadframe, however, a dedicated singulation process as described with reference to FIG. 5C may be necessary.

Figure 5D:
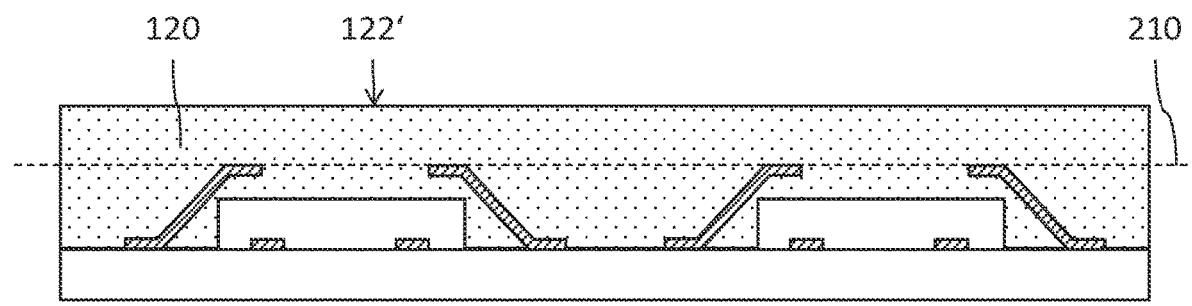

As shown in FIG. 5D, a molding process may be used to fabricate the molded body 120. The plurality of semiconductor dies 110 and the plurality of conductive elements 140 may be partially or completely overmolded. In the case that the singulation process of FIG. 5C was not performed, the common substrate 520 is still present and may be completely or partially overmolded. The conductive elements 140 and/or the rest of the common substrate 520 may comprise openings for allowing the molding material to flow through in order to produce a void-free molded body 120.

The molding material may completely cover the semiconductor dies 110 and/or the conductive elements 140. After the molding process the molding material may be cured, e.g. by a heating process. Prior to thinning the molded body 120 may have a greater thickness than the conductive elements 140 and an initial second side 122' of the molded body 120 may be arranged above the third plane 210. It is also possible that the molding material does not extend to a plane above the third plane 210 after the molding process. For example, a film-assisted molding process may be used, wherein the conductive elements 140 are covered by a film in the third plane and the film is removed after curing the molding material, exposing the conductive elements 140 in the third plane 210.

The structure shown in FIG. 5D comprising the semiconductor dies 110, the conductive elements 140 and the molded body 120 may be termed a "reconstituted wafer" or "reconstituted panel".

Figure 5E:
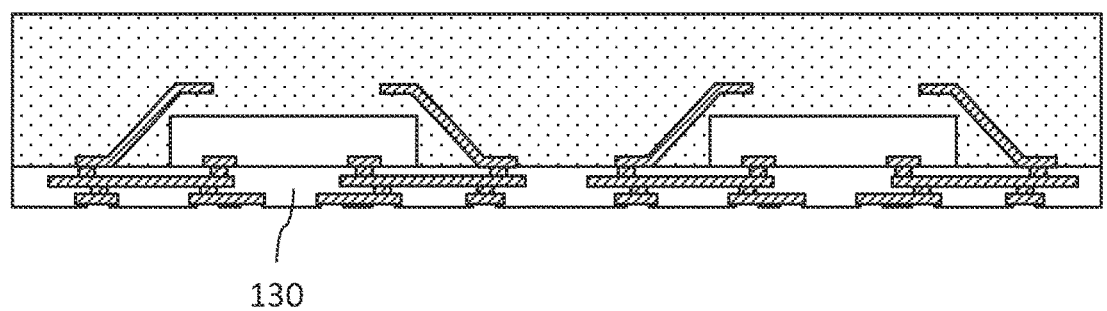

As shown in FIG. 5E, the reconstituted wafer or panel is removed from the temporary carrier 510 and the first redistribution layer 130 is fabricated using any suitable technique. This may e.g. comprise providing an insulating material, drilling through-holes into the insulating material, depositing a conductive material and structuring the conductive material to form conductive tracks.

Figure 5F:
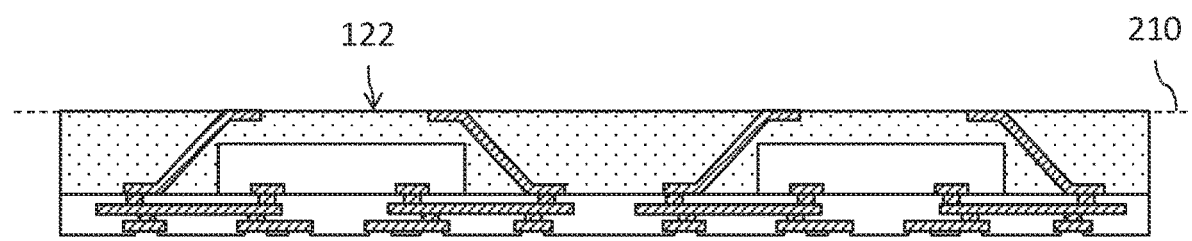

As shown in FIG. 5F, a thinning process is used to expose the conductive elements 140 at the second side 122 of the molded body 120. The thinning process may e.g. comprise grinding the molded body at the initial second side 122' and/or a grinding the common substrate 520. As noted above, the thinning process may also be used for singulating the individual conductive elements 140 from the common substrate 520. In other words, singulation of the conductive elements 140 and exposure of the conductive elements 140 from the molded body 120 may be done with a single common processing step.

After the thinning process further processing steps may be performed. For example, a cleaning process may be performed to remove grinding waste, the second redistribution layer 410 may be fabricated on the second side 122 of the molded body 120, etc.

Figure 5G:
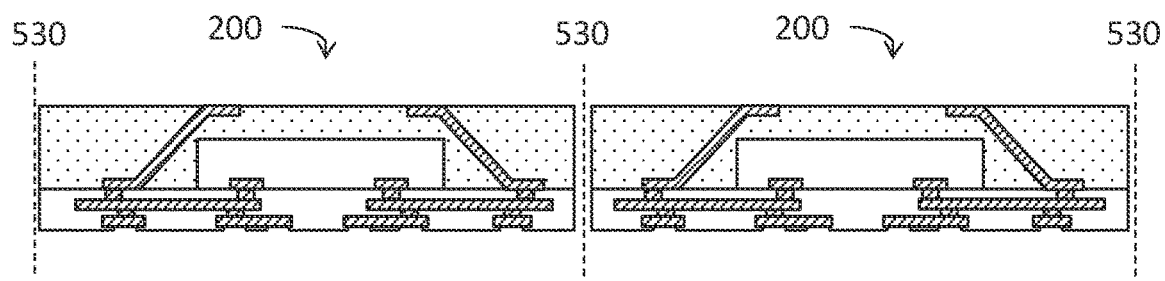

As shown in FIG. 5G, individual packaged semiconductor devices 200 may be singulated from the reconstituted wafer or reconstituted panel by cutting along cutting lines 530. According to an example, the conductive elements 140 are still part of the common substrate 520 at this stage and are singulated from the common substrate 520 by cutting through the common substrate 520 along the cutting lines 530.

Figure 6:
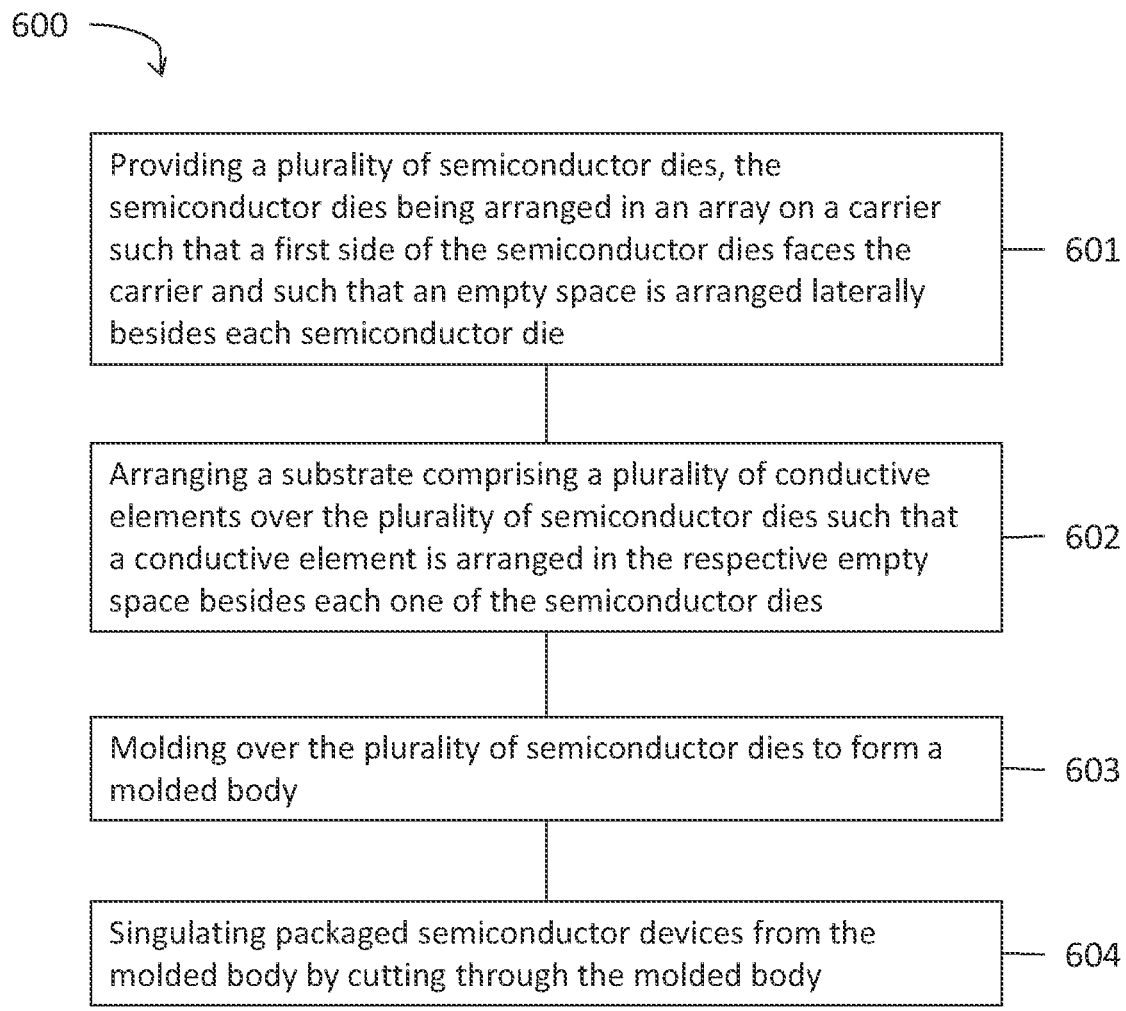
FIG. 6 is a flow chart of an exemplary method for fabricating a packaged semiconductor device.

FIG. 6 is a flow chart of a method 600 for fabricating a packaged semiconductor device. The method 600 may e.g. be used for fabricating the packaged semiconductor devices 100, 200, 300 and 400.

The method 600 comprises at 601 an act of providing a plurality of semiconductor dies, the semiconductor dies being arranged in an array on a carrier such that a first side of the semiconductor dies faces the carrier and such that an empty space is arranged laterally besides each semiconductor die, at 602 an act of arranging a substrate comprising a plurality of conductive elements over the plurality of semiconductor dies such that a conductive element is arranged in the respective empty space besides each one of the semiconductor dies, at 603 an act of molding over the plurality of semiconductor dies to form a molded body, and at 604 an act of singulating packaged semiconductor devices from the molded body by cutting through the molded body.

The method 600 may comprise an optional act of molding over the substrate and thinning the molded body to expose the conductive elements on a second side of the molded body, the second side facing away from the carrier. The method 600 may comprise an optional act of forming a first redistribution layer on the first side of the semiconductor dies and on a first side of the molded body, the first redistribution layer being electrically coupled to the conductive elements. The method 600 may also comprise an optional act of forming a structured conductive layer on a second side of the molded body, the second side of the molded body facing away from the carrier, and the structured conductive layer being electrically coupled to the conductive elements. The structured conductive layer may for example comprise a second redistribution layer, electromagnetic shielding structures or antennas.

EXAMPLES

In the following, the packaged semiconductor device and the method for fabricating a packaged semiconductor device are further described using specific examples.

Example 1 is a method for fabricating packaged semiconductor devices, the method comprising: providing a plurality of semiconductor dies, the semiconductor dies being arranged in an array on a carrier such that a first side of the semiconductor dies faces the carrier and such that an empty space is arranged laterally besides each semiconductor die, arranging a substrate comprising a plurality of conductive elements over the plurality of semiconductor dies such that a conductive element is arranged in the respective empty space besides each one of the semiconductor dies, molding over the plurality of semiconductor dies to form a molded body, and singulating packaged semiconductor devices from the molded body by cutting through the molded body.

Example 2 is the method of example 1, wherein each conductive element extends from a first plane comprising the first side of the semiconductor dies to a second plane comprising a second side of the semiconductor dies, opposite the first side.

Example 3 is the method of example 1 or 2, further comprising: molding over the substrate, and thinning the molded body to expose the conductive elements on a second side of the molded body, the second side facing away from the carrier.

Example 4 is the method of example 1 or 2, further comprising: covering the substrate with a film, and molding over the film-covered substrate.

Example 5 is the method of one of the preceding examples, wherein the substrate is a leadframe.

Example 6 is the method of one of the preceding examples, wherein the substrate comprises metal plated polymer or a semiconductor wafer.

Example 7 is the method of one of the preceding examples, further comprising: forming a first redistribution layer on the first side of the semiconductor dies and on a first side of the molded body, the first redistribution layer being electrically coupled to the conductive elements.

Example 8 is the method of one of the preceding examples, further comprising: forming a structured conductive layer on a second side of the molded body, the second side of the molded body facing away from the carrier, and the structured conductive layer being electrically coupled to the conductive elements.

Example 9 is the method of example 8, wherein the structured conductive layer comprises a second redistribution layer, electromagnetic shielding structures or antennas.

Example 10 is a packaged semiconductor device, comprising: a semiconductor die comprising a first side and an opposing second side, a molded body encapsulating the semiconductor die and comprising a first side and an opposing second side, a first redistribution layer arranged on the first sides of the semiconductor die and the molded body, and a conductive element arranged in the molded body laterally besides the semiconductor die, wherein the conductive element extends from the first redistribution layer at least to a plane comprising the second side of the semiconductor die.

Example 11 is the packaged semiconductor device of example 10, wherein the conductive element is a leadframe part, a metal plated polymer part or a metal plated semiconductor die.

Example 12 is the packaged semiconductor device of example 10 or 11, wherein the conductive element extends from a first point laterally besides the semiconductor die to a second point above the second side of the semiconductor die and within the circumference of the semiconductor die.

Example 13 is the packaged semiconductor device of one of examples 10 to 12, wherein the conductive element comprises a sloped part.

Example 14 is the packaged semiconductor device of example 13, wherein the sloped part has an angle in the range of 30° to 80° relative to the first and second sides of the semiconductor die.

Example 15 is the packaged semiconductor device of one of examples 10 to 14, wherein the conductive element is exposed from the molded body at the second side of the molded body.

Example 16 is the packaged semiconductor device of one of examples 10 to 15, wherein the conductive element forms or is part of an antenna or an electromagnetic shielding structure.

Example 17 is the packaged semiconductor device of one of examples 10 to 16, further comprising: a second redistribution layer arranged on the second side of the molded body, the second redistribution layer being electrically coupled to the conductive element.

Example 18 is an apparatus comprising means for performing the method according to one of the examples 1 to 9.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A packaged semiconductor device, comprising:
a semiconductor die comprising a first side and an opposing second side,
a molded body encapsulating the semiconductor die and comprising a first side and an opposing second side;
a first redistribution layer arranged on the first side of the semiconductor die and the molded body;
a conductive element arranged in the molded body laterally besides the semiconductor die;
wherein the conductive element extends from the first redistribution layer at least to a plane comprising above the second side of the semiconductor die;
wherein the conductive element directly extends from a first point laterally besides the semiconductor die all the way to the second side of the molded body to a second point above the second side of the semiconductor die and within the circumference of the semiconductor die;
wherein the conductive element is electrically coupled with the first redistribution layer and via also with a contact of the semiconductor die;
wherein the molded body extends directly between the second side of the semiconductor die and the conductive element;
wherein the conductive element covers only a part of a surface area of the second side of the semiconductor die; and
wherein the conductive element is exposed from the molded body at the second side of the molded body at the second point.

2. The packaged semiconductor device of claim 1, wherein the conductive element is a leadframe part, a metal plated polymer part or a metal plated semiconductor die.

3. The packaged semiconductor device of claim 1, wherein the conductive element comprises a sloped part.

4. The packaged semiconductor device of claim 3, wherein the sloped part has an angle in the range of 30° to 80° relative to the first and second sides of the semiconductor die.

5. The packaged semiconductor device of claim 1, wherein the conductive element forms or is part of an antenna or an electromagnetic shielding structure.

6. The packaged semiconductor device of claim 1, further comprising:
- a second redistribution layer arranged on the second side of the molded body, the second redistribution layer being electrically coupled to the conductive element.

7. The packaged semiconductor device of claim 1, comprising:
- at least two conductive elements arranged in the molded body laterally besides the semiconductor die and separated from each other;
- wherein each conductive element extends from the first redistribution layer at least to the plane comprising above the second side of the semiconductor die;
- wherein each conductive element extends from a respective first point laterally besides the semiconductor die to a respective second point above the second side of the semiconductor die and within the circumference of the semiconductor die;
- wherein each conductive element is electrically coupled with the first redistribution layer and via also with a respective contact of the semiconductor die; and
- wherein the molded body extends directly between the second side of the semiconductor die and each conductive element.

* * * * *